United States Patent
Li et al.

(10) Patent No.: US 8,007,914 B2
(45) Date of Patent: Aug. 30, 2011

(54) TWO LAYER LTO TEMPERATURE OXIDE BACKSIDE SEAL FOR A WAFER

(75) Inventors: Jin-Xing Li, Singapore (SG);
Boon-Koon Ow, Singapore (SG)

(73) Assignee: Siltronic AG, Munich (DE)

( * ) Notice: Subject to any disclaimer, the term of this patent is extended or adjusted under 35 U.S.C. 154(b) by 963 days.

(21) Appl. No.: 10/528,765

(22) PCT Filed: Sep. 18, 2003

(86) PCT No.: PCT/EP03/10410
§ 371 (c)(1),
(2), (4) Date: Dec. 1, 2006

(87) PCT Pub. No.: WO2004/030060
PCT Pub. Date: Apr. 8, 2004

(65) Prior Publication Data
US 2007/0065671 A1   Mar. 22, 2007

(30) Foreign Application Priority Data
Sep. 25, 2002   (SG) .............................. 200205833-7

(51) Int. Cl.
*B32B 9/04* (2006.01)
*B32B 13/04* (2006.01)
*B32B 9/00* (2006.01)
*B32B 19/00* (2006.01)

(52) U.S. Cl. .................. 428/446; 428/701; 428/702

(58) Field of Classification Search ............... 428/446, 428/448, 702, 701
See application file for complete search history.

(56) References Cited

U.S. PATENT DOCUMENTS

| | | | |
|---|---|---|---|
| 3,769,104 A | 10/1973 | Ono et al. | |
| 5,234,851 A * | 8/1993 | Korman et al. | 438/268 |
| 5,296,385 A | 3/1994 | Moslehi et al. | |
| 5,562,770 A | 10/1996 | Chen et al. | |
| 5,998,283 A * | 12/1999 | Takamizawa et al. | 438/476 |
| 6,149,987 A | 11/2000 | Perng et al. | |
| 6,315,826 B1 | 11/2001 | Muramatsu | |
| 6,440,840 B1 * | 8/2002 | Chen | 438/624 |
| 2002/0076917 A1 * | 6/2002 | Barth et al. | 438/624 |

FOREIGN PATENT DOCUMENTS

| EP | 0 798 765 A2 | 10/1997 |
|---|---|---|
| EP | 0 822 588 A2 | 2/1998 |
| EP | 0 825 639 A2 | 2/1998 |

* cited by examiner

*Primary Examiner* — Timothy M Speer
*Assistant Examiner* — Jonathan C Langman
(74) *Attorney, Agent, or Firm* — Brooks Kushman P.C.

(57) ABSTRACT

A two layer LTO backside seal for a wafer. The two layer LTO backside seal includes a low stress LTO layer having a first major side and a second major side, the first major5 side of the low stress LTO layer adjacent to one major side of the wafer. The two layer LTO backside seal further includes a high stress LTO layer having a first major side and second major side, the first major side of the high stress LTO layer adjacent the second major side of the low stress LTO layer.

3 Claims, 1 Drawing Sheet

TWO LAYER LTO TEMPERATURE OXIDE BACKSIDE SEAL FOR A WAFER

CROSS-REFERENCE TO RELATED APPLICATIONS

This application is the U.S. national phase of PCT application number PCT/EP2003/014010, filed Sep. 18, 2003 and published in English under PCT Article 21(2), which further claims the benefit of Singapore patent application serial number 200205833-7 filed Sep. 25, 2002. The entire disclosures of each of these applications are hereby incorporated by reference.

BACKGROUND OF THE INVENTION

1. Field of the Invention

The invention relates to a process for Low Temperature Oxide (LTO) deposition of a backside seal for wafers using Low Pressure Plasma Enhanced Chemical Vapour Deposition (LPPECVD) and in particular to a two layer LTO backside seal.

2. Background Art

Autodoping is a problem that occurs in silicon wafers that are used for epitaxial deposition. During the heat cycle of the epitaxial process, the highly doped (p+) silicon substrates diffuse out dopant atoms through the backside of the substrate leading to an unintentional overdoping effect on the wafer frontside. This is most noticeable at the edge of the wafer. This leads to an inhomogeneity in the epitaxial dopant profile beyond the tolerance of most device manufacturers.

A backside layer on the wafer reduces the autodoping effect.

Various technologies are used for the deposition of a $SiO_2$ layer. These can roughly be divided into atmospheric and low-pressure applications and further into processes that utilize the ignition of plasma (plasma enhanced: PE) in chemical vapour deposition (CVD), which makes use of pyrolytic surface-catalysis of silicon and oxygen bearing carrier gases.

Haze or epi-haze is non-localised light scattering resulting from uneven surface topography (micro-roughness) or from dense concentrations of surface or near surface imperfections. Semiconductor wafers should have low or no epi-haze.

Film stress is the compressive or tensile forces that affect the film on a wafer. A wafer layer with high film stress is more vulnerable to warpage than a wafer layer with low film stress.

One existing system provides a single LTO layer on the backside of a wafer. However the layer produced is typically thicker than 500 nm and does not solve the problems of haze on the front face of the wafer and warpage of the wafer.

SUMMARY OF THE INVENTION

In broad terms in one aspect the invention comprises a two layer LTO backside seal for a wafer having a first major side and a second major side comprising: a low stress LTO layer having a first major side and a second major side, the first major side of the low stress LTO layer adjacent to one major side of the wafer; and a high stress LTO layer having a first major side and second major side, the first major side of the high stress LTO layer adjacent the second major side of the low stress LTO layer.

In broad terms in a further aspect the invention comprises a method of forming a two layer LTO backside seal for a wafer having two major sides including the steps of forming a low stress LTO layer having a first major side and second major side with the first major side on one major side of the wafer and forming a high stress LTO layer with a first major side and second major side on the second major side of the low stress LTO layer.

In broad terms in a further aspect the invention comprises a pp+ silicon epitaxial wafer including, a p+ substrate a first major side and a second major side, a low stress LTO layer having a first major side and a second major side, the first major side of the low stress LTO layer adjacent the first major side of the p+ substrate, and a high stress LTO silicon oxide layer having a first major side and a second major side, the first major side of the high stress LTO silicon oxide layer adjacent the second major side of the low stress LTO layer.

In broad terms in a further aspect the invention comprises an nn+ silicon epitaxial wafer including, an n+ substrate a first major side and a second major side, a low stress LTO layer having a first major side and a second major side, the first major side of the low stress LTO layer adjacent the first major side of the n+ substrate, and a high stress LTO silicon oxide layer having a first major side and a second major side, the first major side of the high stress LTO silicon oxide layer adjacent the second major side of the low stress LTO layer.

BRIEF DRSCRIPTION OF THE DRAWINGS

Preferred form wafers of the invention will be further described with reference to the accompanying drawings by way of example only and without intending to be limiting, wherein.

DETAILED DESCRIPTION OF THE PREFERRED EMBODIMENTS(S)

Figure 1:
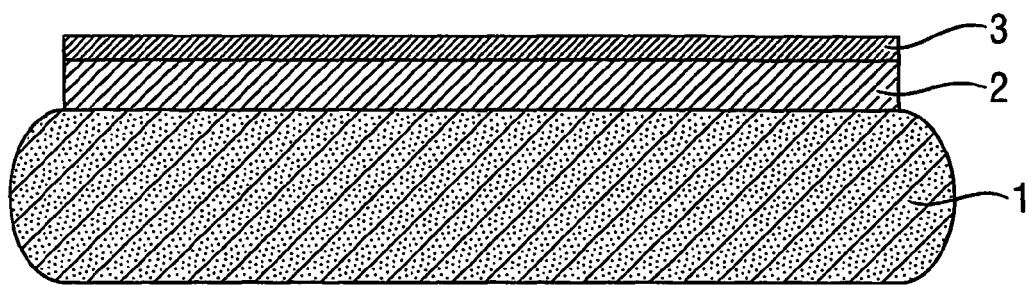
FIG. 1 shows a silicon wafer with a two layer LTO backside seal.

FIG. 1 shows a silicon wafer with two LTO layers forming a backside seal. Substrate 1 is the doped (either p-type or n-type) silicon. Layer 2 is a low stress LTO layer formed using high frequency RF at high power with high silane ($SiH_4$) flow. Layer 3 is deposited on layer 2 using both high and low frequency RF at high power to provide a high density high stress LTO layer with low etch rate during subsequent cleaning processes.

The low stress LTO layer 2 controls the geometry of the wafer to minimise wafer warpage. The low stress LTO layer further acts to improve epi-haze during epitaxy.

The high stress LTO layer has high density and therefore a low etch rate. This allows the backside seal to maintain the low stress LTO layer during subsequent cleaning processes as only a small amount of the high stress LTO layer is available for etching. The low stress LTO layer also has high deposition rate, which means a high throughput. A high stress LTO layer with low etch rate provides a reduction in production costs.

LTO plasma processes commonly use $N_2$ for dilution, $N_2O$ as an oxygen carrying gas, and $SiH_4$ as a silicon carrying gas. In the plasma phase these compounds are dissociated into their respective ionic components and the more mobile electrons are accelerated by high frequency RF at high power coupled to the reaction chamber to strike the plasma. There is a small negative voltage between the positive ions in the plasma and the wafer that rests on a grounded heater block. This potential difference will accelerate the ions towards the wafer surface where the ions form a layer of silicon dioxide ($SiO_2$).

High and low frequency RF power is commonly used in LTO reactors to enhance the LPCVD process. High frequency RF power is used to strike the plasma by accelerating the electrons whereas low frequency RF power is used to enhance the densification of the layer to be formed as it keeps heavier ions mobile for an extended time.

Using the method of the invention a wafer is formed with a double layer LTO backside seal in which the inner layer has low stress and the outer layer has high stress. The stress of the inner layer is typically <100 Mpa and the stress of the outer layer is typically <300 Mpa. The inner layer controls the epi-haze of the wafer and the geometry of the wafer. The outer layer controls the thickness reduction of the backside layer during wet bench cleaning.

Table 1 shows a set of steps for producing a wafer with a double layer LTO backside seal.

pressure etc are chosen from the ranges provided in Table 1. This combination of parameters generates a high deposition rate (typically 5000-12000 Å/min) and results in a low stress $SiO_2$ layer. This layer typically is an imperfect $SiO_2$ network. This layer will keep the wafer in almost stress free status and improve the epi-haze level. Using this layer the epi-haze level of the wafer will be reduced to typically 0.1-1 ppm. The high frequency RF at high power generates a high deposition rate and low film stress. The low pressure in this step assists in creating the high deposition rate, as does the high silane rate. Depositing a low stress layer onto the wafer results in low bow and warp on the wafer after epitaxy deposition. This is difficult to achieve with existing single-layer LTO backside seals, especially those thicker than 500 nm.

TABLE 1

|  | Step 1 | Step 2 | Step 3 | Step 4 | Step 5 |
|---|---|---|---|---|---|
| Pressure (Pa) | 0 | 200-467 | 200-467 | 200-467 | 200-467 |
| Time (sec) | 1-50 | 1-50 | 1-50 | 1-50 | Varies depending on specified thickness of layer |
| Dump (sec) | 0 | 0 | 0 | 0-20 | 0 |
| Temperature (° C.) | 250-600, typically 300-450 | 250-600, typically 300-450 | 250-600, typically 300-450 | 250-600, typically 300-450 | 250-600, typically 300-450 |
| HF RF power (w) | 0 | 0 | 0 | 0 | 200-1600 typically 300-1200 |
| LF RF power (w) | 0 | 0 | 0 | 0 | 0-800 typically 100-600 |
| $N_2$ (sccm) | 0 | 800-7000 typically 1000-4000 | 800-7000 typically 1000-4000 | 800-7000 typically 1000-4000 | 800-7000 typically 1000-4000 |
| $N_2O$ (sccm) | 0 | 0 | 2000-18000 typically 3000-15000 | 2000-18000 typically 3000-15000 | 2000-18000 typically 3000-15000 |
| $SiH_4$ (sccm) | 0 | 0 | 0 | 50-1000 typically 100-600 | 50-1000 typically 100-600 |

|  | Step 6 | Step 7 | Step 8 | Step 9 | Step 10 |
|---|---|---|---|---|---|
| Pressure (Pa) | 200-467 | 200-467 | 200-467 | 200-467 | 0 |
| Time (sec) | Varies depending on specified thickness of layer | 1-50 | 1-50 | 1-50 | 1-50 |
| Dump (sec) | 0 | 0 | 0 | 0 | 0 |
| Temperature (° C.) | 250-600, typically 300-450 | 250-600, typically 300-450 | 250-600, typically 300-450 | 250-600, typically 300-450 | 250-600, typically 300-450 |
| HF RF power (w) | 200-1600 typically 300-1200 | 200-1600 typically 300-1200 | 0 | 0 | 0 |
| LF RF power (w) | 0-800 typically 100-600 | 0-800 typically 100-600 | 0 | 0 | 0 |
| $N_2$ (sccm) | 800-7000 typically 1000-4000 | 800-7000 typically 1000-4000 | 800-7000 typically 1000-4000 | 800-7000 typically 1000-4000 | 0 |
| $N_2O$ (sccm) | 2000-18000 typically 3000-15000 | 2000-18000 typically 3000-15000 | 2000-18000 typically 3000-15000 | 0 | 0 |
| $SiH_4$ (sccm) | 50-1000 typically 100-600 | 0 | 0 | 0 | 0 |

Step 5 of Table 1 shows preferred ranges for pressure, time, temperature, high RF frequency power, low RF frequency power, $N_2$, $N_2O$, and $SiH_4$ so that a low stress LTO layer is formed. To form the low stress LTO layer requires high silane flow, low frequency RF at low power, high frequency RF at high power, and low pressure. Ideally the flow rates, power, Step 6 of Table 1 shows preferred ranges for pressure, time, temperature, high RF frequency power, low RF frequency power, $N_2$, $N_2O$, and $SiH_4$ so that a high stress LTO layer is formed. To form the high stress LTO layer requires low frequency RF at high power, higher pressure, and low silane flow. Ideally the flow rates, power, pressure etc are chosen from the parameters provided in Table 1. The combination of parameters in step 6 will result in low deposition rate and generate a high density LTO layer. To form the high stress LTO layer the low frequency RF power is chosen to be higher than in step 5, the silane flow is chosen to be lower than in step 5 and the pressure is chosen to the higher than in step 5. The high stress LTO layer has a lower etch rate in wet bench processes (which involve HF solutions) preferably equal to about one quarter of the etch rate of the low stress layer formed in step 5. The low frequency RF at high power serves to accelerate ion movement to bombard the deposited layer forming a high stress, high density layer that has a low etch rate. The high deposition pressure assists in creating a low deposition rate and a high density film with high film stress. The low silane flow also assists in creating a low deposition rate, and a high density film with high stress.

In the process used to form the LTO backside seal the high frequency RF is typically 13.56 MHz as this is the industry standard but may be any suitable frequency. The low frequency RF is typically between 100 kHz and 600 kHz. More typically the low RF frequency is 200 kHz as this is the industry standard but may be any suitable frequency.

The combination of the high stress and low stress LTO layers provides significantly greater suppression of visual edge epi-haze over existing single-layer LTO backside seal devices. The double layer backside seal has a high deposition rate. This rate is ideally about three times higher than for an existing single layer LTO backside seal showing time effectiveness in deposition of the two-layer backside seal.

The deposition of the low stress and high stress LTO layers is ideally a continual plasma process. This assists in forming a network between the two LTO backside seal layers. The advantages of forming a network between the high stress and low stress layers include low wafer bow and warp even after epitaxy deposition as will be further described below. This advantage is not affected by the thickness of the LTO backside seal.

The low stress LTO layer deposited with the process recipe of Table 1 has a much higher etch rate in wet bench processes and epitaxy than the high stress LTO outer film. The high stress LTO backside seal layer has a low etch rate in wet bench processes. The outer high stress LTO layer has no stress release during epitaxial high temperature annealing and provides no contribution to the final geometry of the wafer during epitaxy. The only contribution to the final geometry of the wafer during epitaxy is from the frontside epitaxy layer and has some relation to epitaxy thickness.

Referring back to FIG. 1, this Figure shows the silicon wafer 1 with inner low stress LTO layer 2 and outer high stress LTO layer 3. The high stress LTO layer 3 has a lower etch rate than the low stress LTO layer 2 because of the different densities of the layers. After the cleaning process the different etch rates will cause the high stress LTO layer 3 to extend over the low stress LTO layer 2 before epitaxy annealing. This may be overcome by removal of some of the thickness of the high stress LTO layer during the cleaning process.

After the two layer LTO backside seal is formed on the wafer the wafer is subjected to LTO edge removal to remove any LTO film on the edge area of the wafer and any trace LTO film on the wafer front side. The edge exclusion is typically 0.006 to 5 mm. This process does not reduce the thickness of the high stress outer LTO layer.

Following the edge removal process the wafer is subjected to edge polishing and edge polish cleaning. The edge polishing process does not remove any of the LTO film form the backside of the wafer. Edge polish cleaning uses a solution of HF/$O_3$ with HF concentration of typically 0.02 to 0.5%. The edge polish cleaning process typically removes 5-30 nm from the thickness of the LTO backside seal.

After polishing and polish cleaning a post-polish clean is performed. The post-polish clean further removes some of the LTO layer. The concentration of HF in the post-polish clean is typically 0.1-1% resulting in removing typically 10-50 nm of the thickness of the LTO backside seal.

Before epitaxy at least one wet bench cleaning is necessary. The wet bench clean typically includes 0.1-1% HF which results in LTO backside seal thickness removal of 1-30 nm.

One method to control the sharp edge shape of the outer high stress LTO layer 3 is as follows: during the first wet bench process the inner low stress LTO layer 2 with the higher etch rate than the high stress LTO layer is etched, which leaves part of the high stress LTO layer overhanging the low stress LTO layer. When this occurs the exposed underside of the high stress LTO layer will be etched as well as the top of the high stress LTO layer leading to the overhanging portion of the high stress LTO layer having twice the etch rate as the remainder of the high stress LTO layer. Therefore, even before epitaxy the edge shape of the outer high stress LTO layer is controlled through top thickness control.

Figure 2:
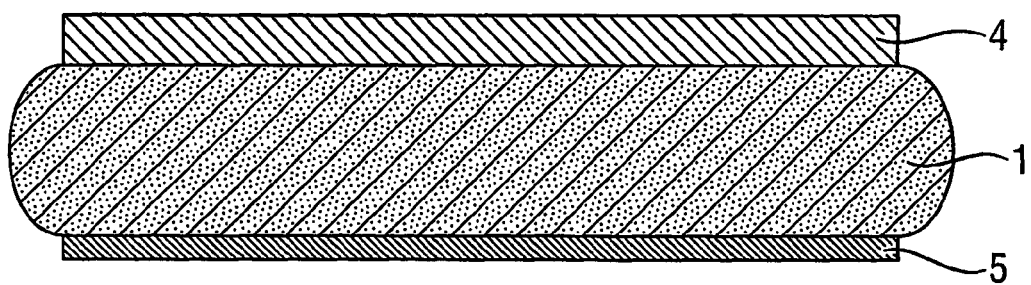
FIG. 2 shows a silicon wafer with a LTO backside seal after deposition of an epitaxial layer on the wafer frontside.

The double layer LTO backside seal has another effect on post-epi warpage. The outer high stress layer of the LTO backside seal has no film stress release during epitaxy. It is well known that a PECVD LTO film contains a large amount of by-elements and is an imperfect network. For example $SiO_x$, $SiNH_x$ and $SiH_x$ (where x=1, 2, 3, 4) are some of the by-elements. A more porous LTO layer has more by-elements. During epitaxy high temperature annealing (typically at temperatures of 1050 to 1200° C.) by-element outgasing and film network rearranging occurs. During epitaxy the LTO layer will tend to become a high density layer, which has almost the same properties as thermal silicon oxidation, e.g. a similar post-epi etching rate. This means that after epitaxy high temperature annealing the LTO film will have almost the same properties as thermal oxidation regardless of the deposition process used. The double layer LTO backside seal has the same etch rate after epitaxy as a single layer LTO backside seal. This is shown in FIG. 2 where a layer of epitaxial material 5 has been deposited on wafer 1 and the high stress and low stress LTO layers have densified to form a single LTO layer 4.

During epitaxy further reductions occur in the thickness of the backside seal. In the high stress layer typically 2-6% of the thickness is lost during epitaxy. For the low stress layer typically 3-10% of the thickness is lost. The loss of thickness in the inner low stress LTO layer relates to rearrangement of the LTO film network as described above.

However the backside seal of the invention will still have a lower etching rate in HF solution. This is because during epitaxy high temperature annealing only hydrogen elements can be outgased and nitrogen elements will be incorporated with the silicon bond. This creates a Si—O—N network in the LTO backside seal that has high density and low etch rate. During the rearrangement of the network of the LTO backside seal the density of the inner low stress layer increases followed by the density of the outer high stress layer. As both the high stress and low stress LTO layers belong to the same network and are formed from the same material there is a better connection between these layers than the connection between the inner layer and the wafer. This will control the wafer geometry to reduce warpage and keep the beneficial low etch rate of the high stress layer.

Comparing the two layer LTO backside seal described above and existing single layer backside seals shows a benefit of the two layer LTO backside seal. Before epitaxy both of the seals provide almost the same contribution to the geometry of the wafer. After epitaxy the single layer LTO seal provides a high stress contribution that increases warpage of the wafer, but the double layer LTO seal maintains the same wafer geometry. This effect is impossible to achieve with a single layer backside seal, especially with a thick backside seal (typically >500 nm).

As well as the double layer LTO backsides seal a polysilicon layer may be included between the wafer and the double layer LTO backside seal. Preferably the thickness of the polysilicon layer is between 0.5 and 2 microns. The polysilicon layer acts as an external gettering for impurity and metal contamination.

A typical double layer LTO backside seal formed using the method described herein preferably is between 1000 and 10000 Å thick. A wafer with a typical epi-thickness of between 1 micron and 20 microns and with a double layer LTO backside seal will typically have warp of less than 50 microns, more typically less than 30 microns, and most typically less than 25 microns as measured by an ADE capacitive tool. The wafer will typically further have bow of less than 30 microns, more typically less than 20 microns, and most typically less than 15 microns as measured with an ADE capacitive tool. The typical localised light scatterers (LLS) of a wafer with a double layer LTO backside seal, as measured with a KLA Tencor SP1 or equivalent laser scattering tool, is: LLS>0.128 microns, less than 100 per wafer and typically less than 30 per wafer; LLS>0.155 microns, less than 50 per wafer and typically less than 10 per wafer; LLS>0.193 microns, less than 30 per wafer and typically less than 10 per wafer; LLS>0.285 microns, less than 20 per wafer and typically less than 5 per wafer. The haze performance is typically less than 50 ppm, more typically less than 20 ppm, and most typically less than 15 ppm. This shows very good haze and LLS performance for wafers with a double-layer LTO backside seal. The double layer LTO backside seal also has a typical etch rate in wet bench cleaning or less than 100 nm.

The silicon epitaxial wafer may be a pp+ wafer having a p-type epitaxy layer and a p+ substrate. Alternatively the silicon epitaxial wafer may be a nn+ wafer have an n-type epitaxy layer and an n+ substrate.

The low stress LTO layer according to the present invention is preferrably formed using high frequency RF power. The power of the high frequency RF is preferably between 200 and 1600 watts and most preferably between 300 and 1200 watts. The high frequency used in forming the low stress LTO layer is preferably about 13.56 MHz.

The low stress layer is preferably formed using low pressure. The pressure used to form the low stress LTO layer is preferably between 200 and 467 Pa.

The low stress LTO layer is formed preferably using high silane flow rate. The silane flow used to form the low stress LTO layer is preferably between 50 and 1000 sccm. The silane flow used to form the low stress LTO layer is most preferably between 100 and 600 sccm.

The temperature used to form the low stress LTO layer is preferably between 250 and 600° C. The temperature used to form the low stress LTO layer is most preferably between 300 and 450° C.

The low stress LTO layer is preferably formed in the presence of $N_2$ with flow rate preferably between 800 and 7000 sccm. The $N_2$ flow rate used in the formation of the low stress LTO layer is most preferably between 1000 and 4000 sccm.

The low stress LTO layer is also preferably formed in the presence of $N_2O$ with flow rate between 2000 and 18000 sccm. The $N_2O$ flow rate used in the formation the low stress LTO layer is most preferably between 3000 and 15000 sccm.

The high stress LTO layer is preferably formed using high frequency RF power at high power. The power of the high frequency RF is preferably between 200 and 1600 watts. The power of the high frequency RF is most preferably between 300 and 1200 watts. The high frequency used in forming the high stress LTO layer is preferably 13.56 MHz.

The high stress LTO layer is also preferably formed using low frequency RF at high power. The high stress LTO layer is preferably formed using low frequency RF with power between 0 and 800 watts. The high stress LTO layer is most preferably formed using low frequency RF with power between 100 and 600 watts. The low frequency used in forming the high stress LTO layer is preferably between 100 and 600 kHz. The low frequency used in forming the high stress LTO layer is most preferably 200 kHz.

The high stress LTO layer is preferably formed using high pressure. The high stress LTO layer is preferably formed using higher pressure than the pressure used to form the low stress LTO layer. The pressure used to form the high stress LTO layer is preferably between 200 and 467 Pa.

The high stress LTO layer is preferably formed using low silane flow. The high stress LTO layer is preferably formed using silane flow preferably between 50 and 1000 sccm. The high stress LTO layer is formed using silane flow most preferably between 100 and 600 sccm. The high stress LTO layer is also preferably formed using silane flow with a slower flow rate than that used in the step of forming the low stress LTO layer.

The temperature used to form the high stress LTO layer is preferably between 250 and 600° C. The temperature used to form the high stress LTO layer is most preferably between 300 and 450° C.

The high stress LTO layer is preferably formed in the presence of $N_2$ with a flow rate preferably between 800 and 7000 sccm. The $N_2$ flow rate used in the formation of the high stress LTO layer is most preferably between 1000 and 4000 sccm.

The high stress LTO layer is also preferably formed in the presence of $N_2O$ with a flow rate between 2000 and 18000 sccm. The $N_2O$ flow rate used in the formation of the high stress LTO layer is most preferably between 3000 and 15000 sccm.

As the low stress and high stress LTO layers are deposited a network is preferably formed between the low stress and high stress layers.

The wafer is preferably a p-type silicon wafer. The wafer is also preferably a n-type silicon wafer.

The pp+ silicon epitaxial wafer according to the present invention includes an epitaxial layer on the second major side of the p+ substrate. The epitaxial layer is preferably between 1 and 50 microns thick.

The thickness of the low stress LTO layer and the high stress LTO layer is preferably between 1000 Å and 10000 Å.

The pp+ silicon epitaxial wafer preferably further includes a polysilicon layer between the substrate and the low stress LTO layer. The thickness of the polysilicon layer is preferably between 0.5 and 2 microns.

The pp+ silicon epitaxial wafer has a warp of preferably less than 50 microns. The pp+ silicon epitaxial wafer has a warp of most preferably less than 20 microns.

The pp+ silicon epitaxial wafer has a bow of preferably less than 30 microns. The pp+ silicon epitaxial wafer has a bow of most preferably less than 15 microns.

The pp+ silicon epitaxial wafer has a haze performance of preferably less than 50 ppm. The pp+ silicon epitaxial wafer has a haze performance of most preferably less than 15 ppm.

The pp+ silicon epitaxial wafer as has a LLS performance greater than 0.128 microns of preferably less than 100 per wafer. The pp+ silicon epitaxial wafer has a LLS performance greater than 0.128 microns of most preferably less than 30 per wafer.

The pp+ silicon epitaxial wafer has a LLS performance greater than 0.155 microns of preferably less than 50 per wafer. The pp+ silicon epitaxial wafer has a LLS performance greater than 0.155 microns of most preferably less than 10 per wafer.

The pp+ silicon epitaxial wafer has a LLS performance greater than 0.193 microns of preferably less than 30 per wafer. The pp+ silicon epitaxial wafer has a LLS performance greater than 0.193 microns of most prefreably less than 10 per wafer.

The pp+ silicon epitaxial wafer has a LLS performance greater than 0.285 microns of preferably less than 20 per wafer. The pp+ silicon epitaxial wafer has a LLS performance greater than 0.285 microns of most preferably less than 5 per wafer.

The pp+ silicon epitaxial wafer is preferably subjected to a wet bench cleaning wherein the etch rate in wet bench cleaning is preferably less than 100 nm.

The nn+ silicon epitaxial wafer according to the present invention further includes an epitaxial layer on the second major side of the n+ substrate. The nn+ silicon epitaxial wafer has an epitaxial layer which is preferably between 1 and 50 microns thick.

The thickness of the low stress LTO layer and the high stress LTO layer of the nn+silicon epitaxial wafer is preferably between 1000 Å and 10000 Å.

The nn+ silicon epitaxial wafer preferably further includes a polysilicon layer between the substrate and the low stress LTO layer. The thickness of the polysilicon layer is preferably between 0.5 and 2 microns.

The nn+ silicon epitaxial wafer has a warp of preferably less than 50 microns. The nn+ silicon epitaxial wafer has a warp of most preferably less than 20 microns.

The nn+ silicon epitaxial wafer has a bow of preferably less than 30 microns. The nn+ silicon epitaxial wafer has a bow of most preferably less than 15 microns.

The nn+ silicon epitaxial wafer has a haze performance of preferably less than 50 ppm. The nn+ silicon epitaxial wafer has a haze performance of most preferably less than 15 ppm.

The nn+ silicon epitaxial wafer has a LLS performance greater than 0.128 microns of preferably less than 100 per wafer. The nn+ silicon epitaxial wafer has a LLS performance greater than 0.128 microns of most preferably less than 30 per wafer.

The nn+ silicon epitaxial wafer has a LLS performance greater than 0.155 microns of preferably less than 50 per wafer. The nn+ silicon epitaxial wafer has a LLS performance greater than 0.155 microns of most preferably less than 10 per wafer.

The nn+ silicon epitaxial wafer has a LLS performance greater than 0.193 microns of preferably less than 30 per wafer. The nn+ silicon epitaxial wafer has a LLS performance greater than 0.193 microns of most preferably less than 10 per wafer.

The nn+ silicon epitaxial wafer has a LLS performance greater than 0.285 microns of preferably less than 20 per wafer. The nn+ silicon epitaxial wafer has a LLS performance greater than 0.285 microns of most preferably less than 5 per wafer.

The nn+ silicon epitaxial wafer is preferably subjected to a wet bench cleaning wherein the etch rate in wet bench cleaning is less than 100 nm.

The foregoing describes the invention including a preferred form thereof. Alterations and modifications as will be obvious to those skilled in the art are intended to be incorporated within the scope hereof as defined in the accompanying claims.

The invention claimed is:

1. A wafer having a two layer backside seal, comprising:
   a silicon wafer substrate having a first major side and second major side and a two layer backside seal comprising;
   a low stress LPPECVD- low temperature oxide (LTO) layer having a first major side and a second major side, the first major side of the low stress LPPECVD-LTO layer in direct contact with the first major side of the wafer substrate; and
   a high stress LPPECVD-LTO layer having a first major side and a second major side, the first major side of the high stress LPPECVD-LTO layer being adjacent to the second major side of the low stress LPPECVD-LTO layer; and
   wherein the stress in the low stress LPPECVD-LTO layer is less than 100 MPa and the stress in the high stress LPPECVD-LTO layer is less than 300 MPa and the stress in the high stress LPPECVD-LTO layer is higher than the stress in the low stress LPPECVD-LTO layer.

2. The wafer as claimed in claim 1, wherein the silicon wafer substrate is p-type doped silicon.

3. The wafer as claimed in claim 1, wherein the silicon wafer substrate is n-type doped silicon.

\* \* \* \* \*